(12) United States Patent
Hori et al.

(10) Patent No.: US 7,116,059 B2
(45) Date of Patent: Oct. 3, 2006

(54) DISPLAY DEVICE AND DISPLAY PANEL DEVICE

(75) Inventors: Nobuyuki Hori, Kawasaki (JP); Yoshimi Kawanami, Kawasaki (JP); Atsuo Ohsawa, Kawasaki (JP); Fumihiro Namiki, Kawasaki (JP)

(73) Assignee: Fujitsu Hitachi Plasma Display Limited, Kawasaki (JP)

( * ) Notice: Subject to any disclaimer, the term of this patent is extended or adjusted under 35 U.S.C. 154(b) by 0 days.

(21) Appl. No.: 11/056,356

(22) Filed: Feb. 14, 2005

(65) Prior Publication Data

US 2005/0184676 A1 Aug. 25, 2005

(30) Foreign Application Priority Data

Feb. 19, 2004 (JP) ............................. 2004-043360

(51) Int. Cl.
*G09G 3/10* (2006.01)
(52) U.S. Cl. ................................ 315/169.3; 315/169.4; 345/76; 345/77
(58) Field of Classification Search ............. 315/169.3, 315/169.4
See application file for complete search history.

(56) References Cited

U.S. PATENT DOCUMENTS 5,684,365 A * 11/1997 Tang et al. ............... 315/169.3
6,573,662 B1 * 6/2003 Van Der Wel ........... 315/169.4
2003/0184225 A1 10/2003 Namiki et al. .............. 313/582

FOREIGN PATENT DOCUMENTS

| JP | 9-198005 | 7/1997 |
|---|---|---|
| JP | 2001-343898 | 12/2001 |
| JP | 2002-319351 | 10/2002 |
| JP | 2003-295779 | 10/2003 |
| KR | 2001-0077727 | 8/2001 |

OTHER PUBLICATIONS

Korean Communication issued in priority Korean Application No. 10-2005-13335.

* cited by examiner

*Primary Examiner*—David Vu
(74) *Attorney, Agent, or Firm*—Staas & Halsey LLP

(57) ABSTRACT

A functional sheet is brought into intimate contact with a front surface of a plasma display panel, and the functional sheet has a structure in which heat diffusion is superior to heat insulation between the plasma display panel and outside air. In addition, a display device includes a controller for controlling a drive voltage pulse train so that power consumption in a unit area in a light emission region within the screen is limited under a set value when one image is displayed.

13 Claims, 12 Drawing Sheets

DISPLAY DEVICE AND DISPLAY PANEL DEVICE

BACKGROUND OF THE INVENTION

1. Field of the Invention

The present invention relates to a display device having a display panel device including a plasma display panel and a functional sheet that is brought into intimate contact with a front surface of the plasma display panel.

2. Description of the Prior Art

Technology development of a plasma display panel (PDP) that is a self-luminous device is directed to a large screen for providing more powerful display. One of the important tasks for a large screen is weight reduction of the panel.

In general, a display device including a plasma display panel has a rigid filter plate having a base of a tempered glass. This filter plate is arranged in front of the plasma display panel with air gap. The filter plate has various functions of adjusting a display color optically, preventing reflection of external light, shielding electromagnetic waves, and shielding near infrared rays concerning displaying operation, and it also has a function of protecting the plasma display panel mechanically.

Arranging the filter plate in front of the plasma display panel is effective for reducing temperature rise in a filter layer due to heat generated in the plasma display panel. Air between the plasma display panel and the filter plate works as a thermal insulator. However, there is a drawback that the heat generated in the plasma display panel may be shut inside an enclosure of the display device, which causes temperature rise of the plasma display panel.

When the plasma display panel becomes high temperature, misdischarge may occur easily. In order to prevent misdischarge, it is necessary to set an upper limit of supplied power to a lower value or to provide a thermal countermeasure such as a high power cooling fan. As quantity of generated heat increases along with the screen size becoming larger, an appropriate thermal countermeasure has to be conducted.

In addition, as the filter plate has a large weight, it is not desired for a large screen of the plasma display panel. In order to reduce a weight of the display device, another structure is suitable in which a thin filter having a base of a resin film is glued directly on the front face of the plasma display panel instead of attaching the filter plate. Japanese unexamined patent publication 2001-343898 discloses a front filter that includes a transparent conductive film for a measure against EMI and a anti-reflection film that is glued on the front side of the front filter.

When a filter is glued on the front surface of the plasma display panel, the filter is apt to be deteriorated due to heat generated by the plasma display panel. As the front surface of the plasma display panel is covered with the filter, heat radiation of the plasma display panel may be impaired. In the conventional structure, however, there was no countermeasure against heat for both the filter and the plasma display panel in a display device in which the filter and the plasma display panel are brought into intimate contact with each other.

SUMMARY OF THE INVENTION

An object of the present invention is to reduce a weight of the device while suppressing excessive temperature rise of the filter and the plasma display panel so that a long life of the filter and stability of a display can be realized. Another object is to prevent overheating of an outer surface of the device so that safety about outer surface temperature during operation can be ensured.

According to an aspect of the present invention, a display device includes a plasma display panel having a screen including a plurality of cells, a functional sheet having at least an optical filter function to light emitted from the screen and being brought into intimate contact with a front surface of the plasma display panel, and a drive voltage output circuit for giving the screen a drive voltage pulse train that generates display discharge plural times corresponding to a gradation. The functional sheet has a structure in which heat diffusion is superior to heat insulation between the plasma display panel and outside air. In addition, the display device includes a controller for controlling the drive voltage pulse train so that power consumption in a unit area in a light emission region within the screen is limited under a set value when one image is displayed.

The inventor found that selecting a thickness of the functional sheet is important for determining thermal properties. FIG. 1 shows an overall relationship between a thickness and a temperature. In the structure in which the functional sheet is brought into intimate contact with a front surface of a plasma display panel (hereinafter referred to as a surface of the panel), if a condition is used for driving in which a temperature on the surface of the panel rises up to approximately 70° C. in the conventional structure in which a filter plate is arranged in front of the plasma display panel via a space, a temperature on a surface of the sheet is substantially kept at an ambient temperature thanks to thermal insulation property of the sheet if the functional sheet has a sufficient thickness that is more than or equal to 20 mm, for example. The surface of the sheet means a front surface of the functional sheet, namely a surface that is the farthest from a rear face that contacts the plasma display panel. If a thickness of the functional sheet is changed without changing a heating condition, a temperature on the surface of the panel becomes low as the thickness decreases because thermal insulation is weaken while thermal diffusing property is enhanced. However, a temperature on the surface of the sheet becomes higher than the ambient temperature. Here, the inventor noted that when a thickness of the functional sheet becomes smaller than a predetermined value, a temperature on the surface of the sheet starts to drop. This predetermined value is specifically a value of approximately 2–10 mm, which is determined in accordance with a material of the sheet. From the above consideration, it is preferable to select a thickness of the functional sheet to a value less than or equal to 2 mm that can obtain thermal diffusion effect for dropping a temperature on the surface of the sheet in order to prevent excessive heat both on the plasma display panel and on the functional sheet. In order that the sheet has an impact absorbing function that is important for protecting a panel under such a limitation of the thickness, it is preferable to use a soft resin layer that can perform the function by a single layer.

In addition, the inventor found a temperature on the surface of the panel and a temperature on the surface of the sheet are determined substantially not by total power supplied to the plasma display panel but by power consumption per a unit area in a light emission region within the screen (this is called a local power density). Namely, when the local power density is controlled to an appropriate upper limit value, excessive heat can be prevented both on the plasma display panel and on the functional sheet.

The upper limit value of the local power density is selected to satisfy the following conditions. (1) The temperature on the surface of the sheet must be a temperature that does not give a thermal shock to a human body for safety when being touched. More specifically, it must not exceed 70° C. (2) In addition, it is desirable that the temperature on the surface of the panel does not exceed 80° C. for preventing misdischarge. (3) The above conditions (1) and (2) must be satisfied even if the ambient temperature is an upper limit of the permissible operating temperature range (40° C., for example).

Adding to the above-mentioned selection of a thickness of the functional sheet and limitation of the local power density, a layer structure of the functional sheet is devised so that a long life of the optical function can be achieved. A layer containing a material that is apt to occur thermal deterioration (for example, a coloring matter for selecting a wavelength) is arranged as close as possible to the front surface so that it is away from the plasma display panel that is a heat source. Furthermore, the layer that is arranged on the rear side of the layer that is apt to occur thermal deterioration is made thick, so that temperature rise of the material that is apt to occur thermal deterioration can be reduced.

According to the present invention, a weight of the device is reduced while excessive temperature rise of the filter and the plasma display panel can be suppressed so that a long life of the filter and stability of a display can be realized.

In addition, overheating of an outer surface of the device is prevented so that safety about outer surface temperature during operation can be ensured.

DESCRIPTION OF THE PREFERRED EMBODIMENTS

Hereinafter, the present invention will be explained more in detail with reference to embodiments and drawings.

A plasma display panel that is useful as a color display device is a preferable object to which the present invention is applied. Hereinafter, an embodiment will be described in which an AC type plasma display panel is used as a display panel, which has cells of a three-electrode surface discharge structure.

EXAMPLE 1

Figure 1:
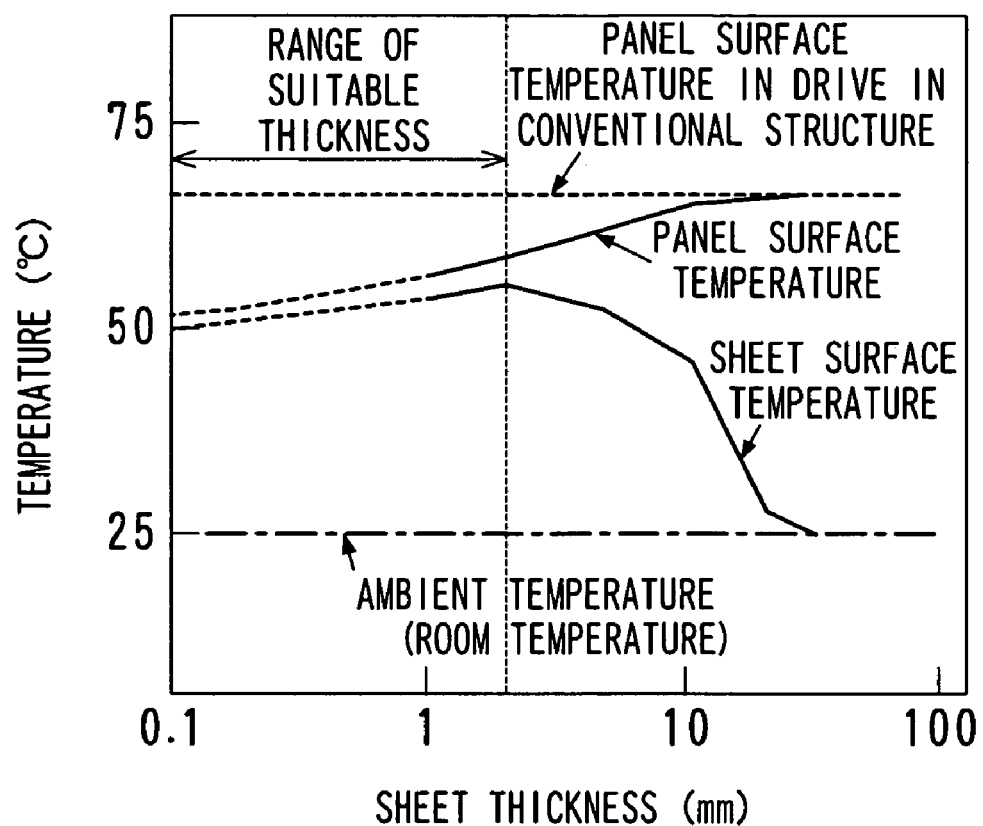
FIG. 1 shows a general relationship between a thickness of a sheet and a surface temperature.
Figure 2:
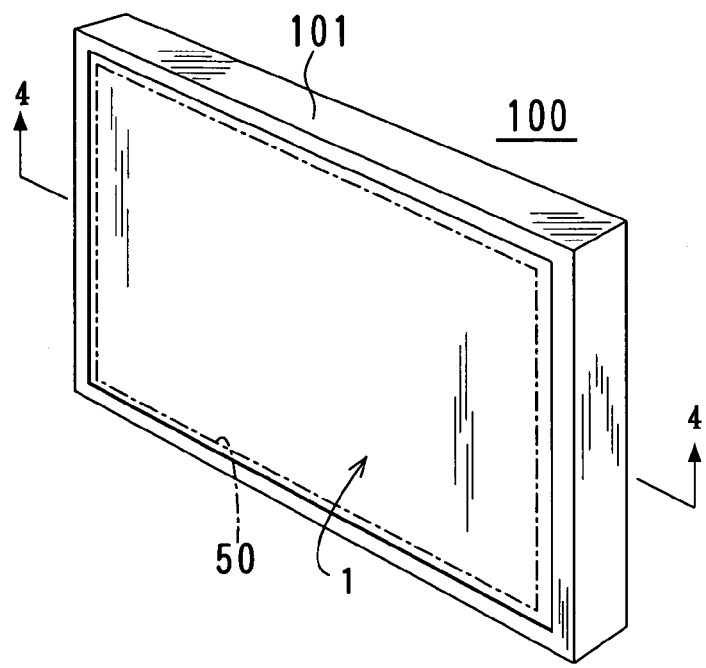
FIG. 2 shows an appearance of a display device according to the present invention.

FIG. 2 shows an appearance of a display device according to the present invention. A display device 100 is a flat type display having a 32-inch diagonal screen 50. A dimension of the screen 50 is 0.72 meters in the horizontal direction and 0.40 meters in the vertical direction. A facing cover 101 that defines a plane size of the display device 100 has an opening that is larger than the screen 50, so that a front face of a display panel device 1 is exposed in part.

Figure 3:
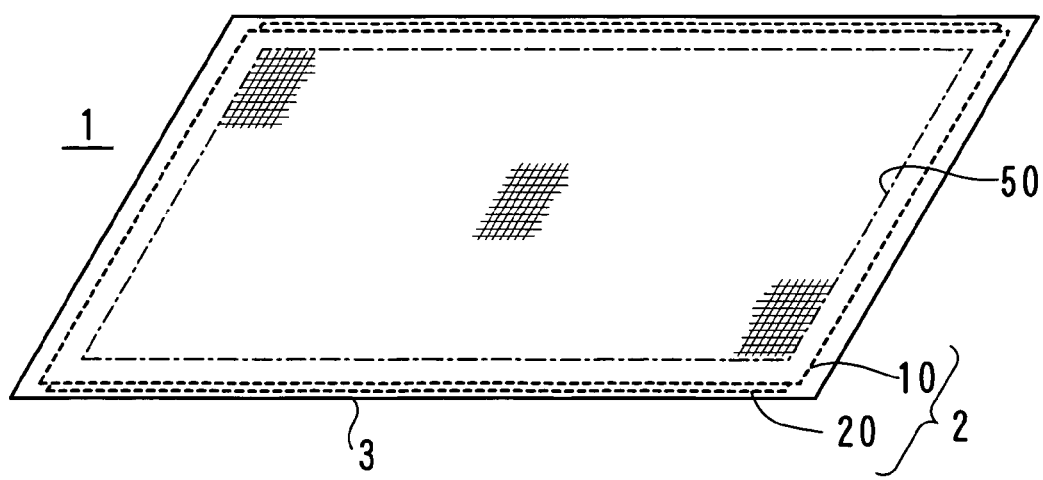
FIG. 3 shows a structure of a display panel device.

FIG. 3 shows a structure of the display panel device. The display panel device 1 includes a plasma display panel 2 that is a device that constitutes a screen and a front sheet 3 that is glued directly on the front face of the plasma display panel 2 to be a display face. The front sheet 3 is a sheet-like structure corresponding to a functional sheet according to the present invention. The plasma display panel 2 is a self-luminous type device that emits light by gas discharge, which includes a front face plate 10 and a rear face plate 20. Each of the front face plate 10 and the rear face plate 20 is a structural element having a base of a glass plate having a thickness of approximately 3 mm. There is no limitation of the structure of the plasma display panel 2 when embodying the present invention. Therefore, a description of an inner structure of the plasma display panel 2 is omitted here.

Figure 4:
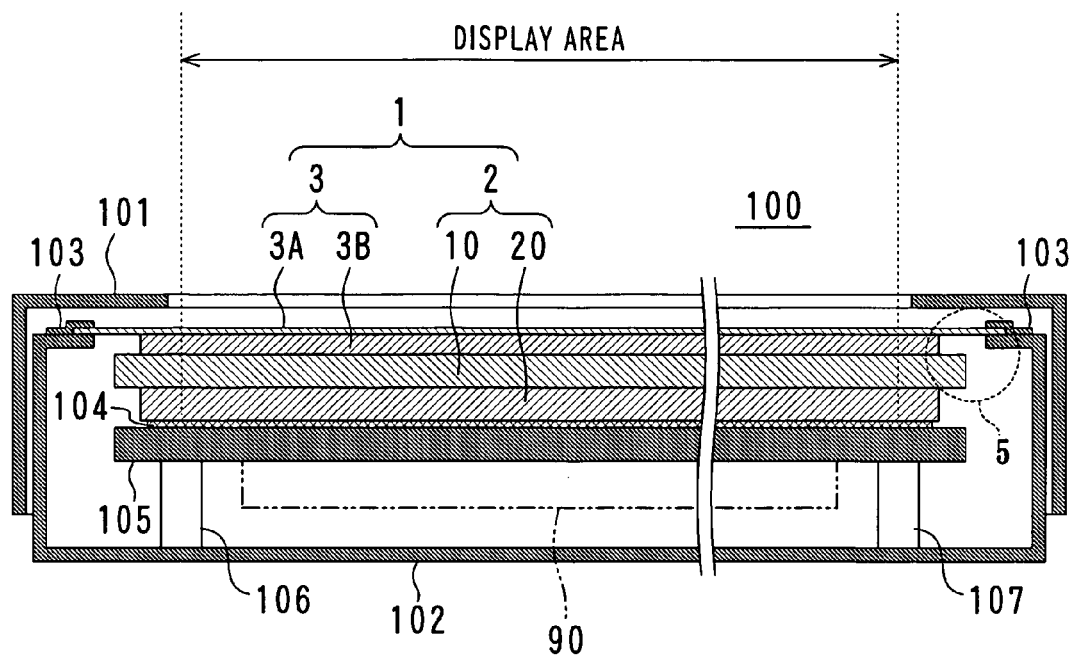
FIG. 4 shows a first example of a structure of the display device.
Figure 5:
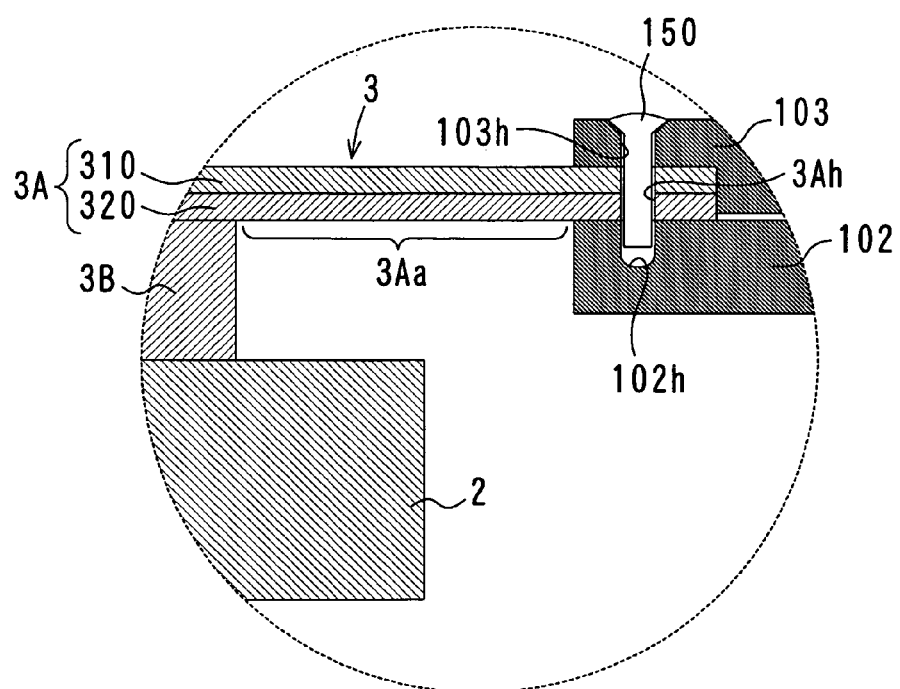
FIG. 5 shows a structure of a principal portion of the display device.
Figure 6:
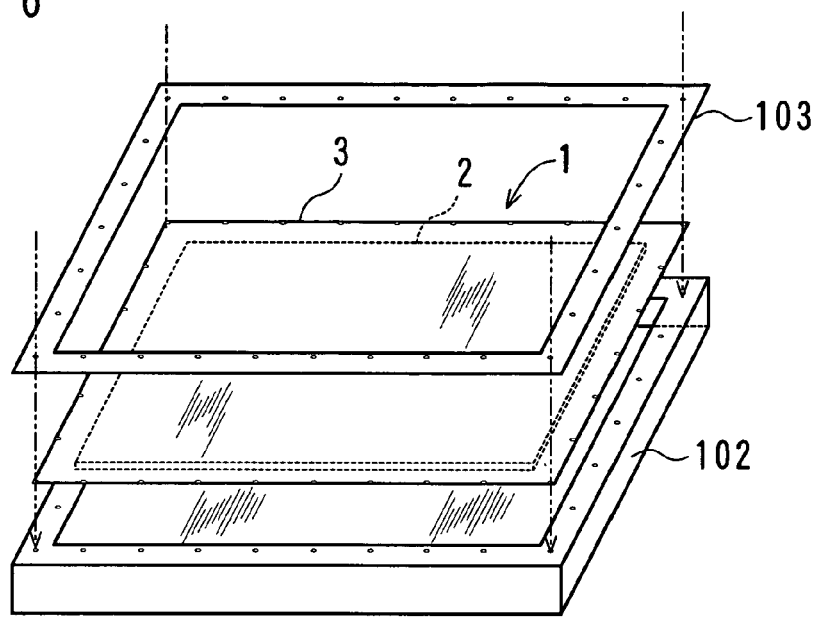
FIG. 6 shows a general outline of fixing of a front sheet.

FIG. 4 is a cross-sectional cut along 4—4 line in FIG. 2 and shows the first example of a structure of the display device. FIG. 5 is an enlarged view of the portion encircled by the dot-dashed line in FIG. 4 and shows a structure of a principal portion of the display device. FIG. 6 shows an outline of fixing of the front sheet.

As shown in FIG. 4, the display device 100 includes a display panel device 1 arranged in a conductive housing 102 to which the facing cover 101 is attached. The display panel device 1 is attached to a chassis 105 made of aluminum via a thermal conducting adhesive tape 104, and the chassis 105 is fixed to the conductive housing 102 via spacers 106 and 107. A driving circuit 90 is arranged on the rear side of the chassis 105. A power source, a video signal processing circuit and an audio circuit are omitted in FIG. 4.

The front sheet 3 is a flexible layered film including a front portion 3A having a thickness of 0.2 mm and having a base of a resin film, and a rear portion 3B having a thickness of approximately 1.0 mm made of a resin layer that are put on each other, which will be described later. In particular, the thin front portion 3A that is a functional film having a multilayered structure has a good flexibility. The plane size of the front sheet 3, more specifically the plane size of the front portion 3A is larger than the plane size of the plasma display panel 2, so that the peripheral portion of the front portion 3A is positioned outside the plasma display panel 2. The plane size of the rear portion 3B is smaller than that of the front portion 3A and larger than that of the screen.

The conductive housing 102 is a metal plate formed in a boxed shape having a rectangular rear face, four side faces and a looped front face. It is also a conductive member surrounding the side faces and the rear face of the plasma display panel 2 apart from them (see FIG. 6). Inner rim of the front face of the conductive housing 102 is placed outside the plasma display panel 2 viewed from the front.

In the display device 100, the front sheet 3 extends along the plasma display panel 2 substantially in flat, and only the end portion thereof contacts the front face of the conductive housing 102. A looped pressure member 103 is disposed in front of the front sheet 3, which is sandwiched between the pressure member 103 and the front face of the conductive housing 102 so that the end portion of the front sheet 3 is fixed to the conductive housing 102. Actually, however, the end portion of the front portion 3A of the front sheet 3 is fixed to the conductive housing 102 as shown in FIG. 5. Here, the front portion 3A includes an electromagnetic wave shielding layer 320 having a function of preventing halation. The electromagnetic wave shielding layer 320 is a rear side layer of the front portion 3A. A plane size of the front portion 3A is the same as that of the front sheet 3 and is larger than that of the rear portion 3B. Therefore, when the front sheet 3 is fixed to the conductive housing 102, the electromagnetic wave shielding layer 320 is connected to the conductive housing 102 electrically. The connection position thereof is apart from the plasma display panel 2.

As shown in FIG. 5 well, the plasma display panel 2 and the conductive housing 102 are connected to each other via a bridge portion 3Aa of the front sheet 3. As the front sheet 3 has flexibility, a force that is applied to the plasma display panel 2 can be relieved by deformation of the portion 3Aa when a relative position between the plasma display panel 2 and the conductive housing 102 is varied due to an impact pressure or heat. An influence on the connection between the front sheet 3 and the conductive housing 102 is also reduced. The deformation includes bending, contraction, expansion and twist.

As a method of fixing the end portion of the front sheet 3, it is preferable to use a plastic rivet 150 for mass production and reducing a weight. It is preferable that the front sheet 3, the conductive housing 102 and the pressure member 103 are provided with holes 3Ah, 102h and 103h, respectively in advance, which are adapted to the rivet 150. Punching process can make many holes at the same time. Although a protrusion corresponding to a thickness of the pressure member 103 may be generated at the end portion of the front sheet 3, increase of a thickness of the display device 100 due to the protrusion is only approximately 1–2 mm.

Figure 7:
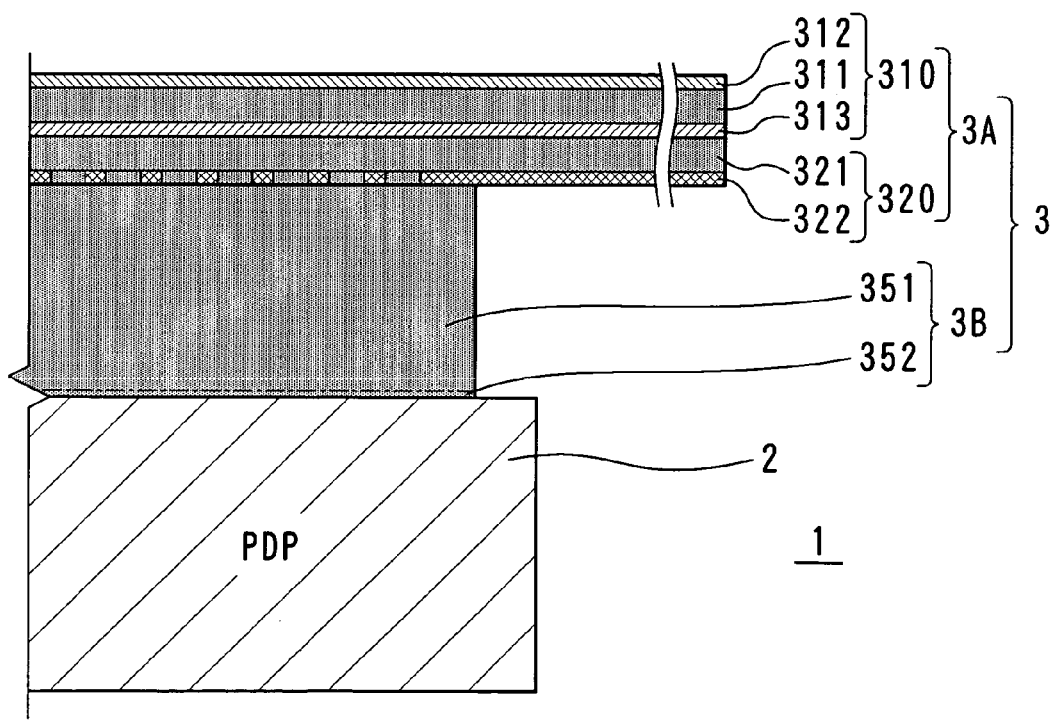
FIG. 7 shows a layer structure of the front sheet.

FIG. 7 shows a layer structure of the front sheet. The front sheet 3 is a layered film having a thickness of approximately 1.2 mm including an optical film layer 310 having a thickness of 0.1 mm, an electromagnetic wave shielding layer 320 having a thickness of 0.1 mm, an impact absorbing layer 351 having a thickness of 1.0 mm, and an adhesive layer 352 having a thickness of a few microns in this order from the front face side. The optical film layer 310 and the electromagnetic wave shielding layer 320 constitute the front portion 3A, and the plane sizes of them are the same. A visible light transmittance of the entire front sheet 3 is approximately 40% after spectral luminous efficiency correction. The impact absorbing layer 351 and the adhesive layer 352 constitute the rear portion 3B. A weight of the front sheet 3 is approximately 500 grams, so the front sheet 3 is much lighter than the conventional filter plate (approximately 2.5 kilograms) for 32-inch screen.

The optical film layer 310 includes a film 311 made of a PET (polyethylene terephthalate), a anti-reflection film 312 that is coated on the front side of the film 311, and a coloring layer 313 that is formed on the rear side of the film 311. The anti-reflection film 312 prevents reflection of external light. However, the function of the anti-reflection film 312 may be changed from AR (anti reflection) to AG (anti glare). The anti-reflection film 312 includes a hard coat for increasing scratch resistance of the surface of the sheet up to pencil hardness 4H. The coloring layer 313 adjusts visible light transmittance of red (R), green (G) and blue (B) for a color display and cuts off near infrared rays. The coloring layer 313 contains an infrared absorption coloring matter for absorbing light having a wavelength within the range of approximately 850–1100 nm, a neon light absorption coloring matter for absorbing light having a wavelength of approximately 580 nm and a coloring matter for adjusting visible light transmittance in a resin. An external light reflection factor of the optical film layer 310 is 3% after the spectral luminous efficiency correction, and the visible light transmittance is 55% after the spectral luminous efficiency correction. In addition, the infrared transmittance is 10% as an average in the wavelength range.

The electromagnetic wave shielding layer 320 includes a film 321 made of PET and a conductive layer 322 having a thickness of 10 microns that is a copper foil with a mesh portion. The visible light transmittance of an area of the conductive layer 322 that overlaps the screen is 80%. As the front surface of the conductive layer 322 is black, the electromagnetic wave shielding layer 320 looks substantially coal-black when it is viewed through the optical film layer 310.

The film 311 of the optical film layer 310 and the film 321 of the electromagnetic wave shielding layer 320 have a function of preventing a glass plate of the plasma display panel 2 from scattering when it is broken in an abnormal situation. In order to realize this function, it is preferable that a total thickness of the film 311 and the film 321 is 50 microns or more. In this example, a total sum of the thickness of the PET is more than or equal to 150 microns.

The impact absorbing layer 351 is made of a soft resin of an acrylic system, and a visible light transmittance thereof is 90%. The impact absorbing layer 351 is formed by applying the resin. When the resin is applied, it enters spaces of the mesh of the conductive layer 322, so that the conductive layer 322 becomes flat. Thus, scattering of light that may be generated by unevenness of the conductive layer 322 can be prevented.

The impact absorbing layer 351 made of the soft resin contributes to thinning of the front sheet 3. A test was conducted in which the display panel device 1 was placed on a horizontal hard floor, and an iron ball having a weight of approximately 500 grams was dropped on the center of the screen. An impact force just before the plasma display panel 2 was broken was approximately 0.73 J. When the plasma display panel 2 without the front sheet 3 was tested under the same condition, the result was approximately 0.13 J. When the display panel device in which only the optical film layer 310 was glued on the plasma display panel 2 was tested under the same condition, the result was approximately 0.15 J. Namely, an improved portion of the shock resistance due to the front sheet 3 is approximately 0.6 J, and most of the improvement that is approximately 0.58 J is obtained by the impact absorbing layer 351. The impact absorbing layer 351 having a thickness of 1.0 mm is practical.

In addition, the impact absorbing layer 351 prevents plastic deformation of the front portion 3A. If a local pressure is applied by a pen tip or the like on the above-mentioned PET layer having a function of preventing scattering, the portion may be broken and the deformation looks like a white scar. If the impact absorbing layer 351 is disposed behind the PET layer, elasticity of the impact absorbing layer 351 may increase resistance of the PET layer to breaking. Softness of the impact absorbing layer 351 may cause a swell of thickness of the entire front sheet 3. However, as the front portion 3A made of a relatively hard material relieves this swell, the impact absorbing layer 351 hardly affects the flatness of the surface of the front sheet 3.

In this example, a rear side surface portion of the resin layer that constitutes the impact absorbing layer 351 works as the adhesive layer 352. The impact absorbing layer 351 has relatively strong adhesiveness to the electromagnetic wave shielding layer 320 made of PET and copper. On the contrary, the adhesive layer 352 has loose adhesiveness to the glass surface that is the front face of the plasma display panel 2. The adhesion force thereof is approximately 2N/25 mm. When the front sheet 3 is peeled, the front portion 3A is not separated from the rear portion 3B so that the front sheet 3 is separated from the plasma display panel 2 normally. "Normally" means that an even peeled surface without a visible remaining matter can be obtained.

Figure 8:
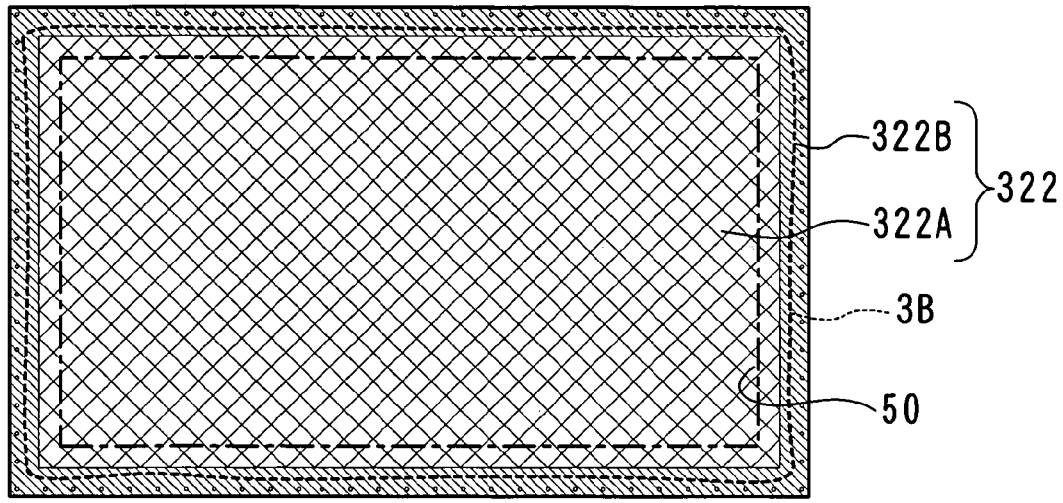
FIG. 8 shows a conductor pattern of an electromagnetic wave shielding layer schematically.

FIG. 8 shows a conductor pattern of the electromagnetic wave shielding layer schematically. The conductive layer 322 of the electromagnetic wave shielding layer is an integrated layer of a conductive mesh 322A that is put on the screen 50 and a looped conductive member 322B surrounding the conductive mesh 322A. A plane size of the conductive mesh 322A is larger than that of the screen 50. A width of four sides constituting the conductive member 322B is approximately 30 mm. The rear portion 3B of the front sheet is arranged so that the rim thereof overlaps the looped conductive member 322B along the entire length. Thus, the rim of the rear portion 3B is hidden behind the conductive member 322B when viewed from the front so that an even appearance is not deteriorated even if the contour of the rear portion 3B is something indefinite in shape. In forming the rear portion 3B, high accuracy is not required although the peripheral portion of the conductive member 322B must be exposed. A variation of approximately 10 mm can be permitted.

Note that although the conductive mesh 322A is drawn to be coarse in FIG. 8, an actual mesh pitch is substantially the same as the cell pitch of the screen 50, approximately 250 microns, for example. It is possible to form alignment marks and rivet holes in the conductive member 322B without increasing the number of manufacturing steps of the conductive layer 322. The alignment marks facilitates the work for gluing the front sheet 3 on the plasma display panel 2.

Figure 9:
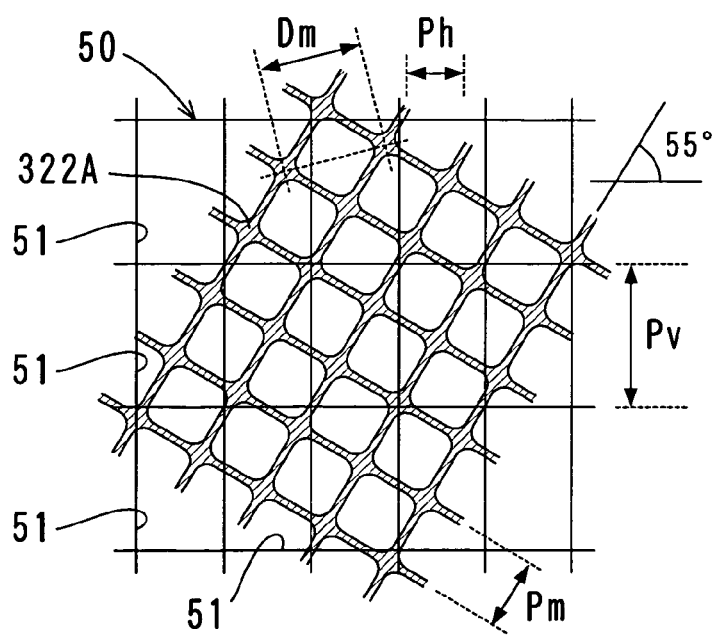
FIG. 9 shows a mesh pitch of the electromagnetic wave shielding layer.

FIG. 9 shows a mesh pitch of the electromagnetic wave shielding layer. A lattice of the conductive mesh 322A has a square pattern, and cells of the mesh are arranged in the direction that is inclined with respect to the arrangement direction of the cells 51 in the screen 50. An angle of the inclination is 55 degrees in this example. The screen 50 includes many cells 51 that are arranged in an orthogonal manner. A cell pitch Pv in the vertical direction is approximately 390 microns, while a cell pitch Ph in the horizontal direction is approximately 280 microns. In contrast, a mesh pitch Pm of the conductive mesh 322A is 250 microns. Here, a length Dm between diagonal lattice points of the mesh is approximately 350 microns, which is shorter than the cell pitch Pv that is longer one of cell pitches in the vertical direction and the horizontal direction of the screen 50. By adjusting this pitch and the angle of inclination of the arrangement direction, the state is obtained in which all the cells 51 and a part of the mesh are overlapped. Namely, the light shield member is arranged in front of all the cells 51, so that the effect of preventing halation is obtained over the entire screen 50 substantially in a uniform manner.

Figure 10:
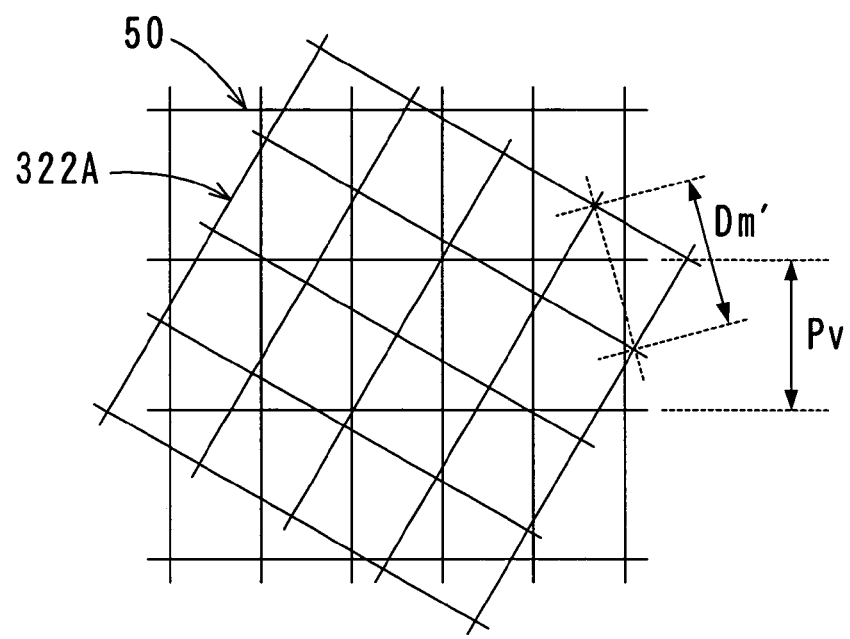
FIG. 10 shows another example of the mesh pitch.

FIG. 10 shows another example of the mesh pitch. In FIG. 10, a length Dm' between the lattice points in the diagonal direction of the conductive mesh 322A is the same as the cell pitch Pv in the vertical direction of the screen 50. In this case, all the cells 51 and a part of the mesh are overlapped. In order to make the overlap of the cells and the mesh more uniform, it is better to make the mesh pitch small. However, considering the strength and the electrical conductivity, it is desirable that a line width of the mesh is more than or equal to 10 microns. It is necessary to note that the visible light transmittance may be too small if the mesh pitch is decreased under the above condition.

Figure 11:
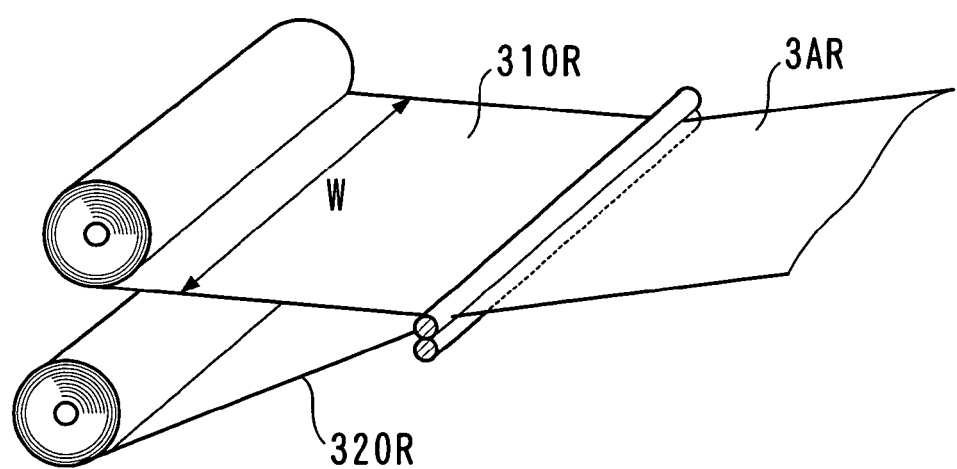
FIG. 11 shows a method for manufacturing a front portion of the front sheet.

FIG. 11 shows a method for manufacturing a front portion of the front sheet. The front portion is manufactured by a roll-to-roll method that is used for a multilayered film. A film 310R having a structure in which an optical film layer continues uniformly and a film 320R having a structure in which many electromagnetic wave shielding layer patterns are connected in a row are manufactured in rolls previously. The film 310R and the film 320R are drawn out of the rolls thereof and are put on each other. Thus, a multilayered film 3AR is obtained and wound in roll, which has a structure in which many front sheets are connected in a row. Here, although the film 320R has a specific pattern including a mesh, precise alignment of patterns between the film 310R and the film 320R is not necessary because the film 310R is uniform in a plan view. Namely, the structure of the front portion 3A includes only one or no nonuniform layer, which is a condition of applying the roll-to-roll method. As the width W of the film 310R is the same as the width W of the film 320R, alignment in the width direction is substantially neglected when putting them on each other in the roll-to-roll method. A little difference of widths and a little misalignment in the width direction between the films can be permitted.

Figure 12:
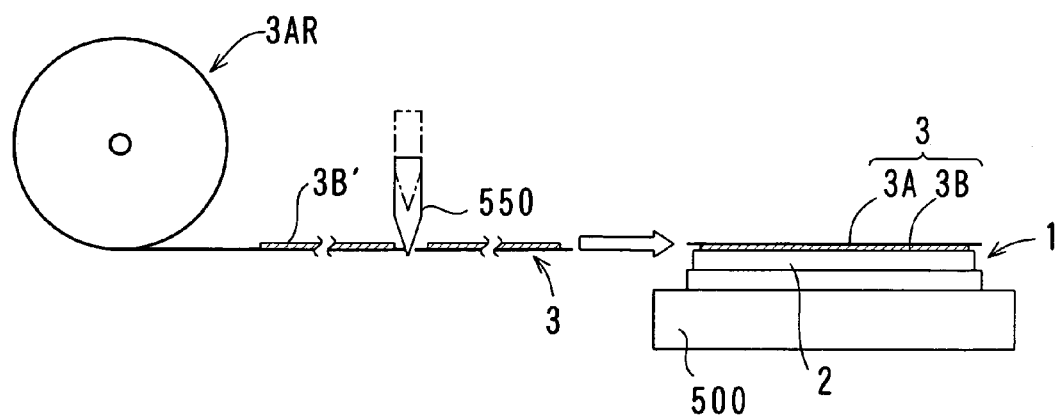
FIG. 12 shows a method for manufacturing a display panel device.

FIG. 12 shows a method for manufacturing the display panel device. The multilayered film 3AR is drawn out of the above-mentioned roll on which the multilayered film 3AR is wound, and a resin 3B' to be the rear portion is applied on the multilayered film 3AR. This multilayered film 3AR is cut by a cutter 550, and the obtained front sheet 3 is glued on a panel module that is placed on a table 500 after being tested. The panel module here means the plasma display panel 2 that is attached to the chassis 105. The plasma display panel 2 of the panel module and the front sheet 3 are integrated to be the completed display panel device 1. As another manufacturing method, it is possible that the multilayered film 3AR is reversed front side rear after the resin 3B' is applied on the same so that it is glued on the panel module, and then it is cut.

As the front portion 3A of the front sheet 3 is formed by cutting the multilayered film 3AR, at least one of the length and the width is the same completely between the optical film layer 310 and the electromagnetic wave shielding layer 320 that constitute the front portion 3A. If cutting of the multilayered film 3AR is performed by punching, the length as well as the width becomes completely the same.

If a foreign matter is found that entered a space between the front sheet 3 and the plasma display panel 2 after the display panel device 1 is completed, manufacturing yield of the display panel device 1 is still high because the front sheet 3 can be reglued. When the structure of the display panel device 1 is adopted, cost reduction by 20% or more can be realized compared with the case where the conventional filter plate is fixed to the front of the plasma display panel 2.

Concerning the device structure, there is a variation in which the conductive housing 102 is divided into the front portion and the rear portion, and the front portion is fixed to the chassis 105 via an insulator. In this variation, it is possible to reduce cost of the panel module by optimal design of the front sheet 3, the plasma display panel 2 and the driving circuit board on the common concept as elements of the panel module.

Hereinafter, countermeasures against heat in the display device 100 will be described in detail.

The front sheet 3 diffuses heat well from the plasma display panel 2 to air. It is because that a thermal conductivity of the front sheet 3 has a value between values of thermal conductivities of the glass that constitutes the plasma display panel 2 and air. The thermal conductivity of the front sheet 3 can be regarded as the same as that of a resin material that constitutes main volume of the front sheet 3. Thermal conductivity values of an acrylic system resin of the impact absorbing layer 251 and PET (polyethylene terephthalate) that is a base material of a multilayered functional film at room temperature (25° C.=298.73K) are approximately 0.27 $W \cdot m^{-1} \cdot K^{-1}$ and approximately 0.23 $W \cdot m^{-1} \cdot K^{-1}$, respectively. In contrast, a thermal conductivity value of the glass is approximately 1 $W \cdot m^{-1} \cdot K^{-1}$, while a thermal conductivity value of air is approximately 0.03 $W \cdot m^{-1} \cdot K^{-1}$. When the front sheet 3 is disposed between the glass and air, heat diffusing action of the plasma display panel 2 is enhanced in general due to reduction of thermal resistances at interfaces although the number of interfaces is increased.

Here, a coloring matter contained in a coloring layer 313 filter of the front sheet 3 is deteriorated rapidly if it is heated up to a temperature of 80° C. or more. The impact absorbing layer 351 has to be superior in thermal resistance to the coloring matter. More specifically, it is desirable that a variation in the visible light transmittance is 5% or less over the entire range of the visible light wavelength as a result of a heat resistance test that requires to keep 80° C. for 500 hours. In the first example, an acrylic system resin is selected as a material of the impact absorbing layer 351, which has the variation less than 1% as a result of the above-mentioned heat resistance test. Other transparent resin (PET or a smoothing resin) has resistance against temperature more than or equal to 90° C. In addition, it is necessary to consider usage at a higher temperature under 40° C. that is an upper limit of a standard environment temperature. More specifically, it is desirable that a variation in the visible light transmittance is 5% or less over the entire range of the visible light wavelength as a result of a durability test that requires to keep a temperature of 80° C. and a humidity of 90% for 500 hours. Concerning the acrylic system resin of the impact absorbing layer 351 in the first example, the variation is less than 1% as a result of the above-mentioned durability test.

This heat radiation action of the front sheet 3 and the following driving control are combined so as to prevent excessive temperature rise of the plasma display panel 2 and the front sheet 3.

Figure 13:
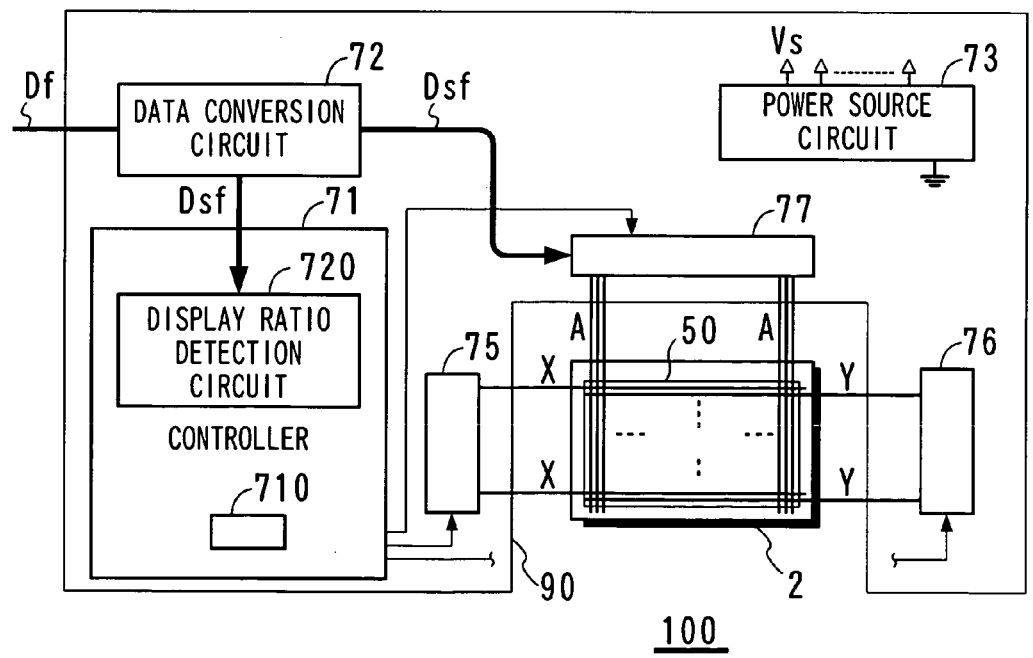
FIG. 13 shows a circuit structure of the display device.

FIG. 13 shows a circuit structure of the display device. The display device 100 has the plasma display panel 2 and the driving circuit 90. In the plasma display panel 2, a display electrode X and a display electrode Y that constitute an electrode pair for generating a display discharge are arranged in parallel with each other. Furthermore, an address electrode A is arranged so as to cross the display electrodes X and Y. The display electrodes X and Y are row electrodes, while the address electrode A is a column electrode. The driving circuit 90 includes a controller 71, a data conversion circuit 72, a power source circuit 73, a display ratio detection circuit 720, an X-driver 75, a Y-driver 76 and an A-driver 77. The X-driver 75 and the Y-driver 76 correspond to a drive voltage output circuit of the present invention.

The driving circuit 90 receives frame data Df together with various synchronizing signals from an external device such as a TV tuner or a computer, and the frame data Df indicate luminance levels of three colors (R, G and B). The frame data Df is stored in a frame memory of the data conversion circuit 72 temporarily. The data conversion circuit 72 converts the frame data Df into sub frame data Dsf for a gradation display, which are sent to the A-driver 77. The sub frame data Dsf is a set of display data in which one bit corresponds to one cell. A value of each bit indicates whether the cell should emit light or not in the corresponding sub frame, more specifically whether an address discharge is necessary or not. The A-driver 77 applies an address pulse to an address electrode A that is connected to cells in which the address discharge should be generated in accordance with the sub frame data Dsf. Application of a pulse to an electrode means to bias the electrode to a predetermined potential temporarily. The controller 71 controls the pulse application and the transmission of the sub frame data Dsf. The power source circuit 73 supplies electric power necessary for driving the plasma display panel 2 to each of the drivers.

The display ratio detection circuit 720 of the controller 71 counts bits that indicate cells to be energized in the sub frame data Dsf so as to detect a "display ratio" for each sub frame. The display ratio is a ratio of the number m of cells to be energized to the total number M of cells in a sub frame that is a binary image (for example, a lighting ratio is m/M×100 in a percentage). The controller 71 increases or decreases the number of application times of sustain pulses for a display discharge in accordance with the display ratio detected by the display ratio detection circuit 720, namely it changes a frequency of a drive voltage pulse train. On this occasion, a relationship between the display ratio and the waveform that is stored in a built-in memory 710 is referred to.

Figure 14:
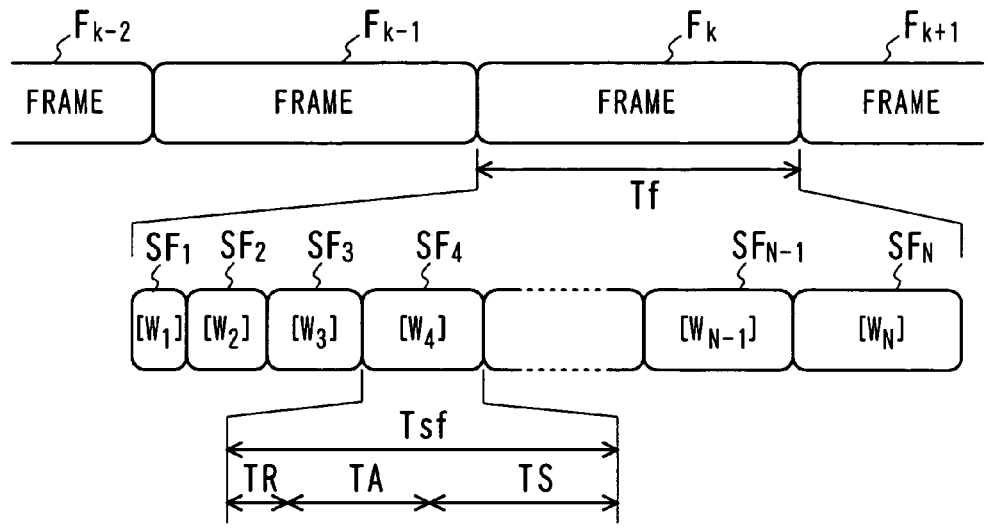
FIG. 14 shows a concept of a frame division.

A general driving sequence of the plasma display panel 2 in the display device 100 is as follows. In a display using the plasma display panel 2, color is reproduced by binary lighting control. Therefore, as shown in FIG. 14, each of sequential frames $F_{k-2}$, $F_{k-1}$, $F_k$ and $F_{k+1}$ (hereinafter the suffixes indicating input orders are omitted) that constitute an input image is divided into a predetermined number N of sub frames $SF_1$, $SF_2$, $SF_3$, $SF_4$, ... $SF_{N-1}$ and $SF_N$ (hereinafter the suffixes indicating display orders are omitted). Namely, each frame F is replaced with a set of N sub frames SF. Luminance weights $W_1$, $W_2$, $W_3$, $W_4$, ... $W_{N-1}$ and $W_N$ are assigned to these sub frames SF in this order. Each of the weights $W_1$, $W_2$, $W_3$, $W_4$, ... $W_{N-1}$ and $W_N$ defines the number of display discharge times of each sub frame SF. Although a sub frame arrangement is in the order of weight in FIG. 14, other orders can be adopted. In accordance with this frame structure, a frame period Tf that is a frame transmission period is divided into N sub frame periods Tsf, and one sub frame period Tsf is assigned to each sub frame SF. In addition, the sub frame period Tsf is divided into a reset period TR for initializing wall charge, an address period TA for addressing and a sustaining period TS for sustaining. The reset period TR and the address period TA have constant lengths regardless of the weight, while the sustaining period TS has a length that is longer as the weight is larger. Therefore, the sub frame period Tsf also has a length that is longer as the weight of the corresponding sub frame SF is larger. Among N sub frames SF, the order of the reset period TR, the address period TA and the sustaining period TS is the same. For each sub frame, initialization, addressing and sustaining of wall charge are performed.

Figure 15:
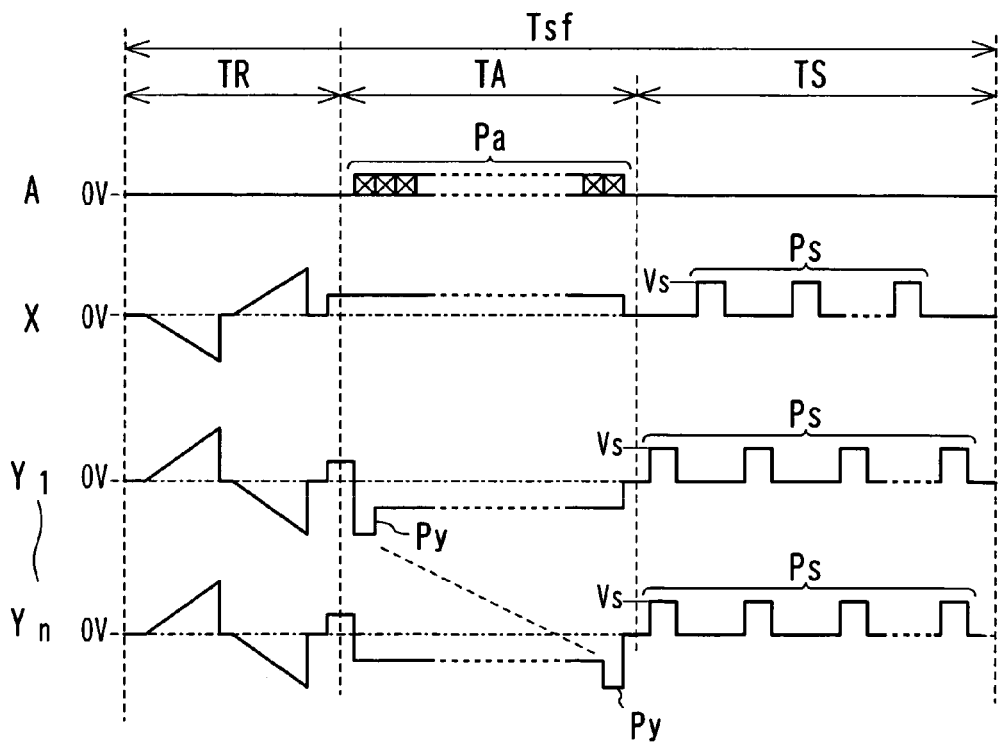
FIG. 15 shows a general outline of drive voltage waveforms.

FIG. 15 shows a general outline of drive voltage waveforms. In FIG. 15, suffixes (1,n) of reference numerals of the display electrodes Y indicate arrangement orders of the corresponding rows, respectively. The illustrated waveforms are merely one example, an amplitude, a polarity and a timing thereof can be modified variously. A pulse base potential is not limited to the ground potential but can be an offset potential such as −Vs/2.

During the reset period TR of each sub frame, a ramp waveform pulse having a negative polarity and a positive polarity is applied in sequence to all the display electrodes X, while a ramp waveform pulse having a positive polarity and a negative polarity is applied in sequence to all the display electrodes Y for example, so that an increasing voltage is applied between the display electrodes of all cells. An amplitude of the ramp waveform pulse increases gradually at a rate that is small enough for generating a micro discharge. A composite voltage that is a sum of amplitude values of pulses applied to the display electrodes X and Y is applied to the cell. The micro discharge that is generated when the increasing voltage is applied a first time causes an appropriate wall voltage having the same polarity generated in all the cells regardless of a lighted or a non-lighted state in the previous sub frame. The micro discharge that is generated when the increasing voltage is applied a second time adjusts the wall voltage to a value corresponding to a difference between the discharge start voltage and the amplitude of the applied voltage.

During the address period TA, wall charge that is necessary for sustaining is formed only in cells to be energized. All the display electrodes X and all the display electrodes Y are biased to a predetermined potential, and a scan pulse Py is applied to one display electrode Y corresponding to a selected row every row selection period (every scan period for one row). At the same time as this row selection, an address pulse Pa is applied to only address electrodes A corresponding to selected cells that should generate an address discharge. Namely, in accordance with the sub frame data Dsf of the selected row, a potential of the address electrode A is controlled in a binary manner. In the selected cell, a discharge is generated between the display electrode Y and the address electrode A, which causes a surface discharge between display electrodes. These discharges in series correspond to the address discharge.

Then, during the sustaining period TS, a sustain pulse Ps having an amplitude Vs of approximately 150–180 volts and a rectangular waveform is applied alternately to the display electrode Y and the display electrode X. Thus, the drive voltage pulse train having alternating polarities is applied between the display electrode X and the display electrode Y. When the sustain pulse Ps is applied, a display discharge of a surface discharge form is generated in a cell where a predetermined wall charge remains. The number of application times of the sustain pulse Ps corresponds to the weight of the sub frame as described above.

In the above-mentioned driving sequence, the present invention is strongly pertinent to the sustaining process during the sustaining period TS. Most of heat that heats the plasma display panel 2 is generated by the display discharge. The heat generated by the display discharge is much larger than heat generated by the electrodes due to power loss.

Figure 16A:
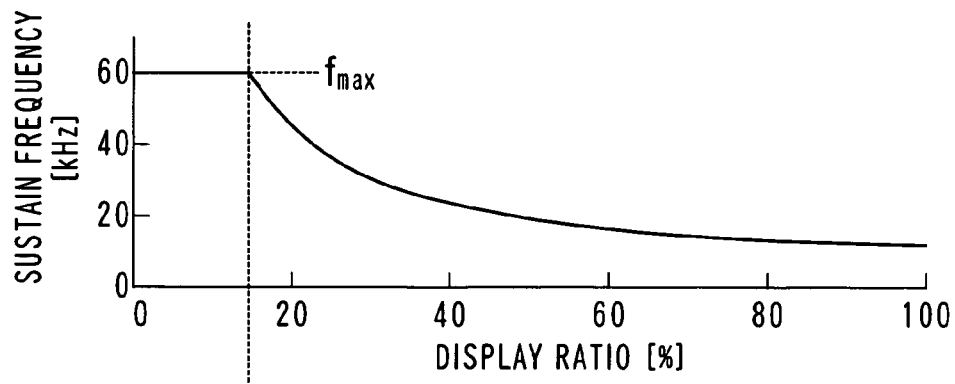
FIGS. 16(A) and 16(B) show a general outline of an automatic power control.
Figure 16B:
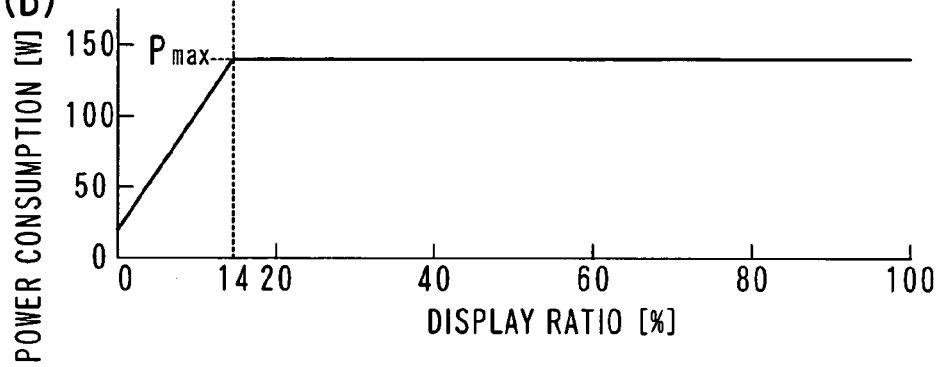
Figure 17A:
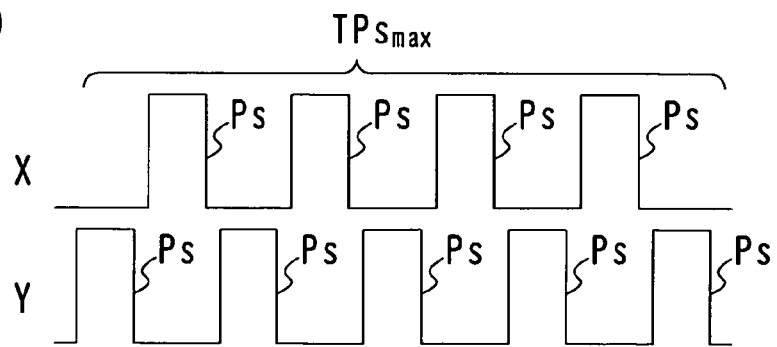
FIGS. 17(A) and 17(B) show drive voltage pulse trains.
Figure 17B:
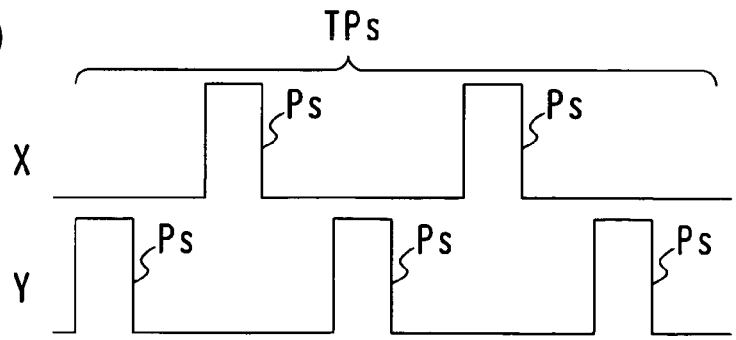

FIGS. 16(A) and 16(B) show a general outline of an automatic power control. An automatic power control (APC) is a technique of realizing a display that is as bright as possible and is seen easily while saving power by utilizing a phenomenon that even if light emission quantity in each cell is small in a bright display as a whole screen, it is not conspicuous. The automatic power control enables controlling so that power consumption does not exceed a permissible limit. If the display ratio is smaller than a constant value (14% for example), the automatic power control is not performed substantially, and the number of sustain pulses in a display of one frame is set to a maximum number of sustain pulses that can be applied during a time period defined by the frame period. Namely, a sustain frequency is a maximum value $f_{max}$. In this case, a drive voltage pulse train $TPs_{max}$, as shown in FIG. 17(A) is applied to the display electrode X and the display electrode Y. Power consumption in one cell becomes at the maximum. If the display ratio is smaller than the above-mentioned constant value, power consumption is larger as the display ratio is larger. If the display ratio is the above-mentioned constant value, the power consumption is an upper limit value $P_{max}$ in a permissible range. When the display ratio exceeds the constant value, the automatic power control function of the controller 71 is activated, and the sustain frequency decreases along increase of the display ratio. In this case, a drive voltage pulse train TPs as shown in FIG. 17(B) having a frequency lower than the drive voltage pulse train $TPs_{max}$ is applied to the display electrode X and the display electrode Y.

The plasma display panel 2 has the 32-inch diagonal screen 50 as described above, and the area of the screen 50 is 0.288 square meters (0.72 meters×0.40 meters). For this plasma display panel 2, the automatic power control limits the power consumption up to 150 W. Here, a local temperature on a surface of the glass (a surface of the panel) of the plasma display panel 2 depends on density of power that is supplied for generating the display discharge in the noted region, namely the above-mentioned "local power density". The local power density becomes the maximum value at a display ratio when the automatic power control function starts to work, and a temperature rise on the panel surface at a light emission area in the screen becomes the most outstanding when a frame of such a display ratio is displayed. However, if a light emission pattern consisting of cells that generate a display discharge are spread out, temperature is dropped a little due to heat diffusion in the direction along the plane. In the case of the light emission pattern of approximately 10 cm square or more, temperature on the surface of the panel rises at substantially the highest rate.

In this example, the automatic power control function starts to work at the display ratio of 14%. The display ratio is 100% in the entire white.color display in which all the cells emit light. Therefore, an area of the light emission region corresponding to the display ratio of 14% is approximately 0.04032 square meters (=0.288×0.14). Although power to be supplied by the power source circuit 73 is 150 watts, total power that is supplied to the cells to emit light is approximately 95 watts because the driving circuit and the electrodes have their losses. In this case, the local power density is approximately 2356 watts per square meter, and the luminance of display is approximately 350 candelas per square meter. If the display of the display ratio 14% is maintained in this state, the local temperature on the surface of the panel rises excessively. Therefore, the controller 71 reduces the local power density down to 1500 watts per square meter that is set as a normal maximum value during five minutes. More specifically, the sustain frequency is reduced so that the input power drops from 95 watts to approximately 60 watts. When the local power density is 1500 watts per square meter, the luminance of display is approximately 220 candelas per square meter. If the display of the display ratio 14% is maintained in this state, rising of the local temperature is saturated in approximately two hours.

Note that the local power density becomes the normal maximum value also in a white color block display having the display ratio of 22% in which the automatic power control function works. The final temperature in this case is similar to the case of the display ratio 14% with difference within 1° C. because an area of the light emission region is sufficiently large.

In the display device 100 of this example in which the above-mentioned countermeasures against heat were conducted, a temperature on the surface of the sheet rose to 53° C. as a stationary state under the condition of the room temperature 25° C. in the white color block display of the display ratio 14% that is the strictest from a viewpoint of a degree of temperature rise. Under the condition of 40° C. that is the upper limit temperature in the permissible environment of a typical specification, the temperature on the surface of the sheet reached 64° C. As the front sheet 3 did not become in an overheated state, any deterioration of optical characteristics of the filter was not found in the test even after continuous display during 1000 hours. As a heat radiation property of the front sheet 3 is designed well, a difference between the temperature on the surface of the panel and the temperature on the surface of the sheet was substantially within 10° C. Namely, the highest temperature on the surface of the panel was 75° C. under the condition of room temperature at 40° C. This is lower than 80° C., so little misdischarge was generated.

EXAMPLE 2

Figure 18:
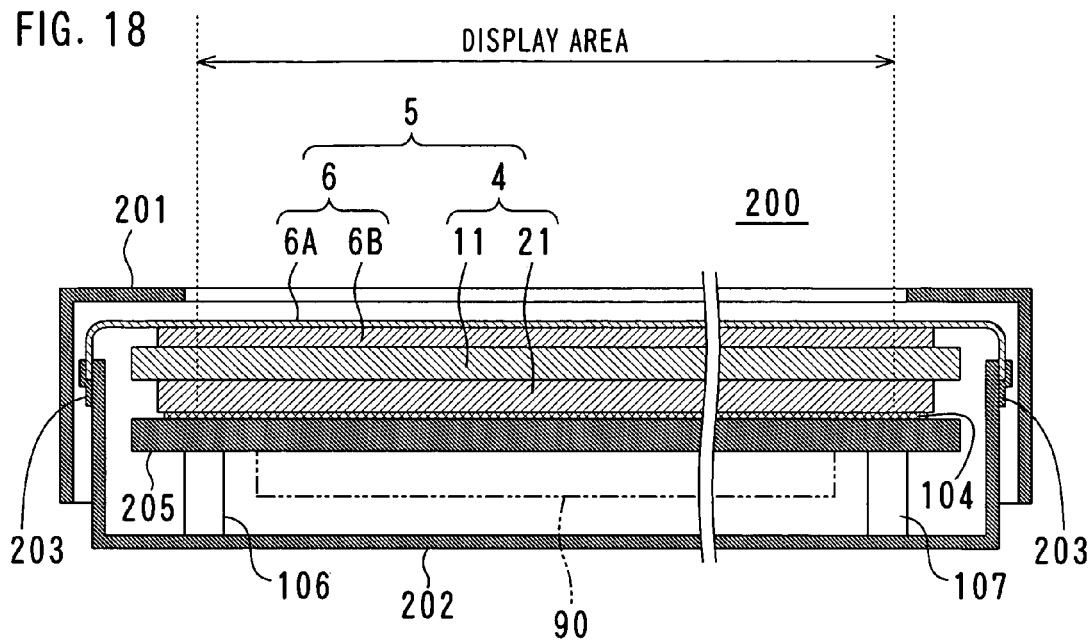
FIG. 18 shows a second example of a structure of the display device.

FIG. 18 shows a second example of a structure of the display device. A basic structure of the display device 200 is the same as the above-mentioned display device 100 except for a screen size. In FIG. 18 and the following diagrams, structural elements denoted by the same reference numerals as in FIG. 4 are the same structural elements as of the display device 100.

The display device 200 has a 42-inch diagonal screen. A dimension of the screen is 0.92 meters in the horizontal direction and 0.52 meters in the vertical direction. The display panel device 5 that is a screen module of the display device 200 includes a plasma display panel 4 and a front sheet 6. The plasma display panel 4 includes a front face plate 11 and a rear face plate 21, and the front sheet 6 includes a front portion 6A and a rear portion 6B.

In the display device 200, a plane size of the front portion 6A is larger than the above-mentioned example, four sides of the front portion 6A are bent to the rear side substantially in perpendicular manner, and end portions of the front portion 6A are fixed to a conductive housing 202. The fixing is performed by sandwiching the front portion 6A between a side face of the conductive housing 202 and a looped pressure member 203. The fixing position thereof is in rear of the front surface of the plasma display panel 4 and is away from the plasma display panel 4. In the fixing position, the electromagnetic wave shielding layer of the front portion 6A and the conductive housing 202 contact each other so that they are connected in conductive manner.

When the front portion 6A is bent, the fixing position becomes closer to the plasma display panel 4 than the case where it is not bent so that a plane size of the conductive housing 202 can be reduced. In addition, the fixing position becomes rear more than the case where the front portion 6A is not bent, so a thickness of the conductive housing 202 (size of the side face) can be reduced. Downsizing of the conductive housing 202 contributes to weight reduction of the display device 200.

Note that if a factory that manufactures the display panel device 5 (a device manufacturer) and a factory that completes the display device 200 by assembling the display panel device 5 in the housing (a set manufacturer) are separated, it is necessary to prevent the front portion 6A from being damaged at the peripheral portion during transportation of the display panel device 5. For example, when the display panel device 5 is attached to the chassis 205 made of aluminum for being transported, a package size can be downsized by fixing the end portion of the front portion 6A to the chassis 205 via an insulator.

Figure 19:
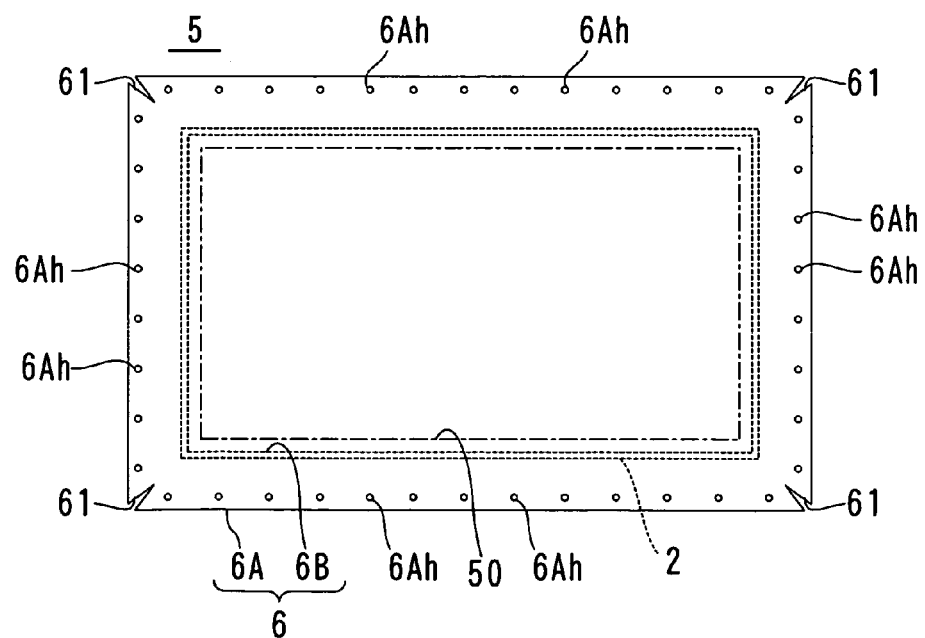
FIG. 19 shows a general outline of a plane shape of the display panel device.

FIG. 19 shows a general outline of a plane shape of the display panel device. The front sheet 6 of the display panel device 5 has notches 61 that are formed on four corners of the front portion 6A so as to facilitate the bending process of the front portion 6A. In addition, plural holes 6Ah are formed along the rim of the front portion 6A, and the holes 6Ah are used for fixing the front portion 6A.

Figure 20:
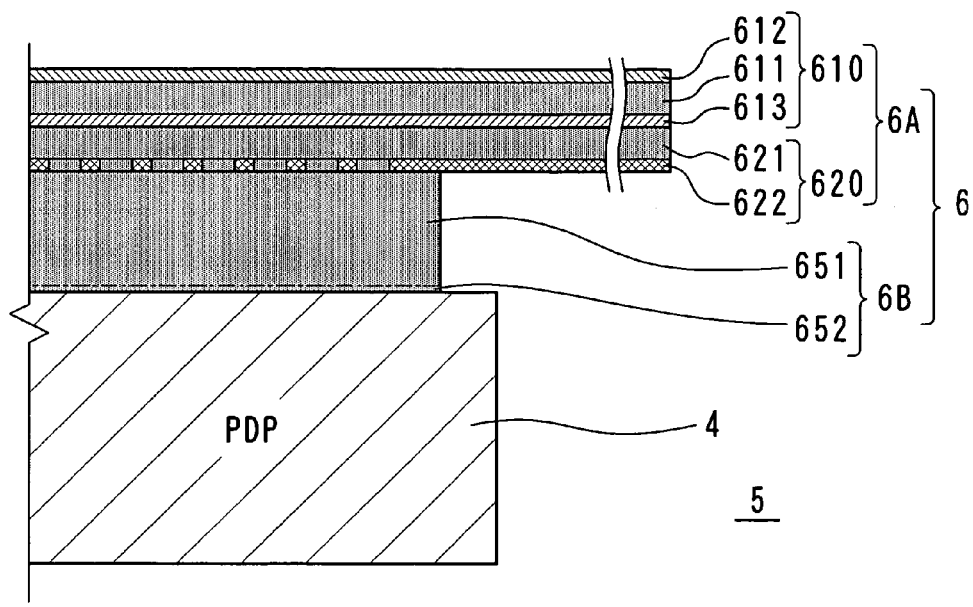
FIG. 20 shows a layer structure of the front sheet according to a second example.

FIG. 20 shows a layer structure of the front sheet according to a second example. A layer structure of the front sheet 6 is the same as the above-mentioned front sheet 3 except for a thickness of the rear portion. The front sheet 6 is a layered film having a thickness of approximately 0.7 mm including an optical film layer 610 having a thickness of 0.1 mm, an electromagnetic wave shielding layer 620 having a thickness of 0.1 mm, an impact absorbing layer 651 having a thickness of 0.5 mm, and an adhesive layer 652 having a thickness of a few microns in this order from the front face side. The optical film layer 610 and the electromagnetic wave shielding layer 620 constitute the front portion 6A, and plane sizes of these layers are the same. The impact absorbing layer 651 and the adhesive layer 652 constitute the rear portion 6B. A visible light transmittance of the entire front sheet 6 is approximately 40% after spectral luminous efficiency correction. A weight of the front sheet 6 is approximately 500 grams and is much lighter than the conventional filter plate of the same size (approximately 4.2 kg).

The optical film layer 610 includes a film 611 made of PET, a anti-reflection film 612 that is coated on the front face side of the film 611 and a coloring layer 613 that is formed on the rear side of the film 611. The anti-reflection film 612 includes a hard coat that enhances scratch resistance of the surface of the sheet up to pencil hardness 4H. The coloring layer 613 adjusts visible light transmittance of red (R), green (G) and blue (B) for a color display and cuts off near infrared rays. An external light reflection ratio of the optical film layer 610 is 3% after the spectral luminous efficiency correction, and a visible light transmittance is 55% after the spectral luminous efficiency correction. In addition, a transmittance of infrared rays is 10% as an average within the wavelength range.

The electromagnetic wave shielding layer 620 includes a film 621 made of PET and a conductive layer 622 having a thickness of 10 microns that is a copper foil with a mesh portion. The visible light transmittance of an area of the conductive layer 622 that overlaps the screen is 80%.

The impact absorbing layer 651 is made of an acrylic soft resin, and a visible light transmittance thereof is 90%. The impact absorbing layer 651 is formed by applying the resin. When the resin is applied, it enters spaces of the mesh of the conductive layer 622, so that the conductive layer 622 becomes flat. Thus, scattering of light that may be generated by unevenness of the conductive layer 622 can be prevented.

In order to confirm the function of the impact absorbing layer 651, a test was conducted in which the display panel device 5 was placed on a horizontal hard floor, and an iron ball having a weight of approximately 500 grams was dropped on the center of the screen. An impact force just before the plasma display panel 4 was broken was approximately 0.40 J. When the plasma display panel 4 without the front sheet 6 was tested under the same condition, the result was approximately 0.13 J. When the display panel device in which only the optical film layer 610 was glued on the plasma display panel 4 was tested under the same condition, the result was approximately 0.15 J. Namely, an improved portion of the shock resistance due to the front sheet 6 is approximately 0.26 J, and most of the improvement that is approximately 0.24 J is obtained by the impact absorbing layer 651. The impact absorbing layer 651 having a thickness of 0.5 mm is practical.

EXAMPLE 3

Figure 21:
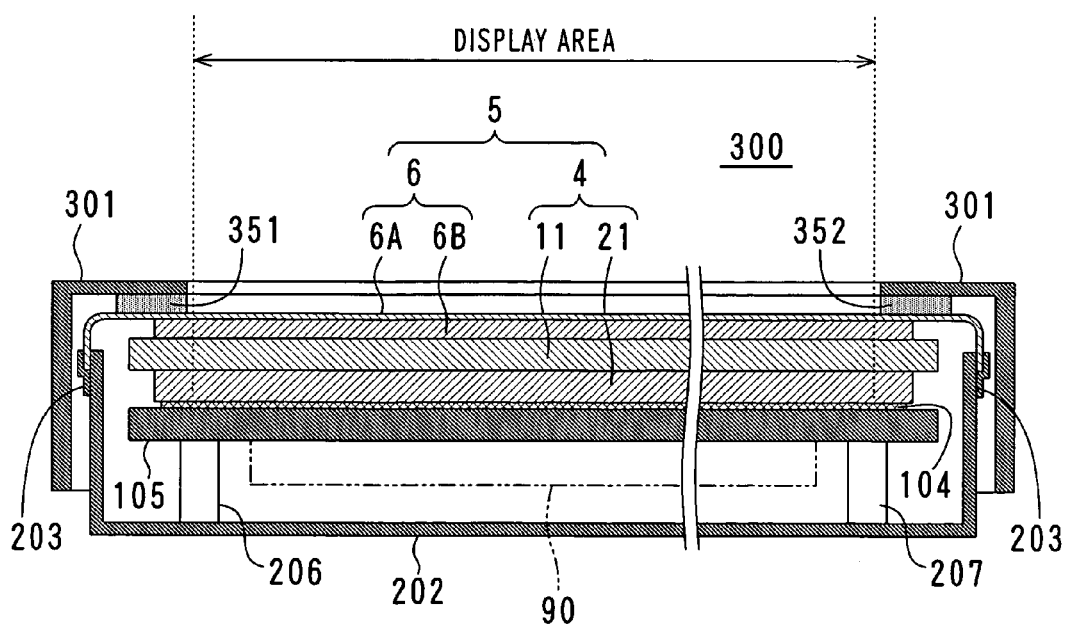
FIG. 21 shows a third example of a structure of the display device.

FIG. 21 shows a third example of a structure of the display device. A structure of a display device 300 is substantially the same as the above-mentioned display device 200.

The display device 300 is characterized in that the inner rim of the front face of the facing cover 301 is close to a screen area, and sound absorbing members 351 and 352 are arranged between the facing cover 301 and the front sheet 6. The sound absorbing members 351 and 352 are glued on the facing cover 301 in advance, and the display panel device 5 is covered with the facing cover 301 so that the sound absorbing members 351 and 352 are pressed onto the front sheet 6. As the sound absorbing members 351 and 352 are flexible sponge, no excessive force is applied to the plasma display panel 4. As audible sound noises due to vibration of the plasma display panel 4 (called an abnormal sound) increases at a peripheral portion of the plasma display panel 4, the noises can be reduced substantially by arranging the sound absorbing members 351 and 352. Although the abnormal sound can be shielded by the filter plate in the conventional structure in which the filter plate is arranged in front of the plasma display panel, the sound can be reflected by the filter plate and propagate from the rear side to the front side. On the contrary, as the abnormal sound is absorbed substantially completely in the display device 300, a quiet display environment can be obtained. Sounds generated by the plasma display panel 4 propagate along the rear portion 6B that is glued on the plasma display panel 4, so it is preferable to arrange the sound absorbing members 351 and 352 to overlap the rear portion 6B.

EXAMPLE 4

Figure 22:
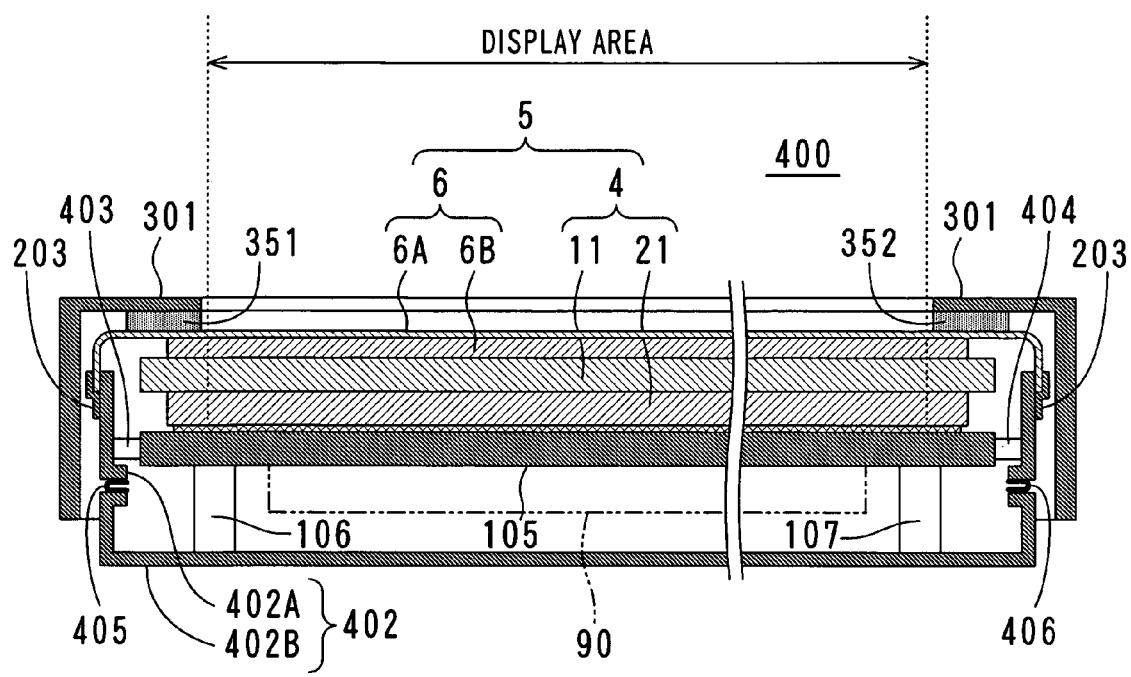
FIG. 22 shows a fourth example of a structure of the display device.

FIG. 22 shows a fourth example of a structure of the display device. A structure of the display device 400 is substantially the same as the above-mentioned display device 300. The display device 400 is characterized in that the conductive housing 402 includes a frame-like structure 402A that is a front portion thereof and a box-like structure 402B that is a rear portion thereof. The structure 402A is fixed to the chassis 105 via insulator spacers 403 and 404, and a rim portion of the front sheet 6 is fixed to the structure 402A via the pressure member 203. The structure 402B and the facing cover 301 are attached to the panel module in which the display panel device 5, the chassis 105 and the structure 402A are integrated. When attaching the structure 402B, connection members 405 and 406 are used for securing conductive connection between the structure 402A and the structure 402B.

In the fourth example, cost of the panel module can be reduced by optimal design of the structural elements of the panel module on the common concept. In a manufacturing form that a device manufacturer and a set manufacturer complete the display device 400, it is possible to incorporate the entire or a part of the electric circuit including a power source into the panel module, or it is possible that the set manufacturer attaches a part or the entire of the electric circuit to the panel module together with the facing cover 301.

According to the above-mentioned first through fourth examples, halation can be reduced more than the case where the front sheet 3 or 6 is not glued. More specifically, a white color pattern of an approximately 10 cm square was displayed at a luminance of 350 candela per square meter, and a length from the end of the white color pattern to the end of the range in which light emission having a luminance of 1 candela or more per square meter appears was measured as an indicator of expansion of the halation. When the front sheet 3 or 6 was glued, the halation was reduced by 0.7 times. Note that when the conventional filter plate is disposed in front of the plasma display panel away from the panel front face by 1 cm, the halation is increased by 2.5 times compared with the case where the filter plate is not arranged.

According to the above-mentioned first through fourth examples, in the conductive layer 322 of the electromagnetic wave shielding layer 320, the conductive mesh 322A that passes light and the looped conductive member 322B surrounding the conductive mesh 322A are formed integrally, so cost of the display panel device 1 or 5 can be reduced compared with a structure in which a conductive tape is attached around the mesh made of woven conductive fibers.

It is possible to reduce content of the coloring matter for controlling the transmittance in the optical film layer 310 or 610 by reduced portion of the visible light transmittance thanks to the electromagnetic wave shielding layer 320 or 620, so that the optical film layer 310 or 610 hardly generates aging deterioration. According to an accelerated test in which the front sheet 3 or 6 is kept in a temperature of 80° C. or more, sufficient optical characteristics are obtained after 20000 hours or more.

The rear portion 3B or 6B is sufficiently thick compared with the front portion 3A or 6A, so deviation of temperature inside the front portion 3A or 6A can be relieved. Therefore, a degree of thermal deterioration of the coloring matter contained in the front portion 3A or 6A can be uniformed.

According to the above-mentioned first through fourth examples, the end rim of the front portion 3A or 6A of the front sheet 3 or 6 protrudes from the rear portion 3B or 6B by 1 cm or more, and this protruding portion can be used as a grip portion for peeling. Namely, the front sheet 3 or 6 can be peeled easily from the plasma display panel 2, and it is not necessary to spend much cost for a machine for the peeling work.

According to the above-mentioned first through fourth examples, the front sheet 3 or 6 having a hard front side and a soft rear side is arranged on the display surface to be in intimate contact, it is possible to realize mechanical protection of the plasma display panel 2 or 4, protection of the sheet itself from damage, and improvement of display quality due to flatness of the front surface.

According to the above-mentioned first through fourth examples, the impact absorbing layer 351 or 6515 that is also the adhesive layer 352 or 652 has a sufficient thickness of 0.1 mm or more, so micro foreign particles that may exist on the surface of the plasma display panel 2 or 4 hardly cause lift of the front sheet 3 or 6. In an ordinary clean booth (at atmospheric pressure), plasma display panel 2 or 4 is brought into intimate contact with the front sheet 3 or 6 in sufficiently stable manner. When the plasma display panel 2 or 4 was operated at a temperature of 40° C. and under a reduced pressure corresponding to an altitude of 2000 meters that is the strictest environment for usage of the display device, no air bubble or peeling was generated at the interface between the plasma display panel 2 or 4 and the front sheet 3 or 6 even at the condition where a temperature on the surface of the front sheet 3 or 6 became 64° C. and a temperature on the surface of the panel became 67° C.

According to the above-mentioned first through fourth examples, a light and safe display device can be realized by gluing the front sheet 3 or 6 directly on the plasma display panel 2 or 4. The highest temperature on the surface of the sheet can be set to a value lower than the lowest temperature 70° C. that may give a human body a thermal shock when being touched. When a flame is applied onto the surface of the sheet, the flame is not expanded because thermal conductivity between the plasma display panel 2 or 4 and the front sheet 3 or 6 is good. The display device 100, 200, 300 or 400 is also superior in flame retardant properties. More specifically, when a flame of a gas burner was applied onto the surface of the sheet perpendicularly for 30 seconds, it started burning without a flame and the burning stopped within the area of approximately 20 mm. When a thickness of the rear portion 3B or 6B was 1.2 mm, no burning occurred in the same condition.

The above-mentioned embodiment has the following variations.

It is possible to extend the longest time from five minutes to approximately 30 minutes for permitting that the local power density of the power supplied to the plasma display panel 2 or 4 exceeds the normal maximum value. Even if the longest time is extended, it is rare that a temperature on the surface of the panel exceeds the highest temperature defined by the specification. However, in a particular case where the same pattern is continuously displayed, there is a potential that a temperature on the surface of the panel exceeds the highest temperature. Therefore, it is preferable that the above-mentioned the longest time is set to a short time. Here, a temperature distribution on the screen can be predicted by calculation in accordance with a heat diffusing speed on the surface of the panel and the power density distribution on the screen. It is possible to install a program for such a prediction into the controller and to control excessive quantity of the power density above the normal maximum value and an exceeding time so that a display is always performed at the maximum brightness within the range where the front sheet 3 or 6 does not exceed the highest temperature of the specification.

If a main material that constitutes the front sheet 3 or 6 has a thermal conductivity ratio more than or equal to 0.1 $W \cdot m^{-1} \cdot K^{-1}$ and less than or equal to 0.4 $W \cdot m^{-1} \cdot K^{-1}$ at the room temperature, the same effect as the above-mentioned example using PET and an acrylic system resin can be obtained concerning the temperature control.

As the electromagnetic shielding layer 320 or 620 having translucency and electric conductivity, a silver multilayered film can be incorporated instead of the mesh. As the silver multilayered film has a function of cutting off infrared rays, an infrared absorbing coloring matter is not necessary when forming the optical film layer 310 or 610. Concerning the coloring layer 313 or 613, a multilayered structure including a plurality of layers containing different coloring matters can be adopted instead of a single-layered structure. However, it is preferable that an arrangement position of the layer containing the coloring matter be the front portion rather than the rear portion that is closer to a source of heat so as to reduce an influence of heat.

It is useful to design a red color fluorescent material (for example, (Y, Gd, Eu)PVO4) and a discharge gas (for example, Ne—Xe gas having Xe ratio of 5% or more and gas pressure of 500 Torr, and Xe partial pressure of 20 Torr or more) of the plasma display panel 2 appropriately so as to reduce quantity of orange color light. If an optical filter containing coloring matter of a wavelength range for absorbing orange color light selectively becomes unnecessary, heat resistance can be improved more and cost of the front sheet 3 can be reduced more.

The most rear face of the front sheet 3 or 6 can be formed as an adsorption surface having a self adsorption function. For example, after forming the impact absorbing layer 351 or 651, a film made of a silicone material is formed on the surface of the impact absorbing layer 351 or 651. Thus, it is possible to repeat peeling and sticking between the front sheet 3 or 6 and the plasma display panel 2 many times. This can reduce a loss of the display panel device during manufacturing process and also contribute to maintenance after it is assembled to the display device. It is because that the front sheet can be replaced easily when it is damaged. It is also possible that only the anti-reflection layer 312 or 612 is made as a sheet having the self adsorption function and is glued on the remaining portion of the front sheet 3 or 6. In this case, the anti-reflection layer 312 or 612 may be glued in a step other than the step of gluing the remaining portion of the front sheet 3 or 6 on the plasma display panel 2 or 4, so that a size thereof may be different from a size of the electromagnetic wave shielding layer 320 or 620. A strength of the adsorption is desirably adjusted so that peeling can be done only by a force applied in the perpendicular direction, and the adsorption force is desirably 4N/25 mm or less (when peeling speed is 50 mm/min).

Instead of a silicone material, an acrylic foam material that is similar to the material of the impact absorbing layer 351 or 651 may be used, and similar effect can be obtained.

Note that a cleaning process such as using water or air injection should be performed prior to gluing the front sheet 3 or 6, if necessary, and such cleaning process should also be performed on an adsorption surface when a peeled front sheet is reused.

The adhesive layer 352 or 652 of the rear portion 3B or 6B of the front sheet 3 or 6 may be a layer of a material different from the impact absorbing layer 351 or 651. In this case, regardless of a distortion of the surface of the plasma display panel 2 or 4, it is desirable to set a thickness of the adhesive layer 352 or 652 to a value more than or equal to 100 microns so that adhesiveness to the front sheet 3 or 6 becomes good.

Although a plasma display panel is exemplified in the above description, the device constituting a screen is not limited to the plasma display panel, and the present invention can also be applied to a device in which other display panel such as an EL (Electro Luminescence), an FED (Field Emission Display) or a liquid crystal display constitutes a screen.

The present invention contributes to improvement of display quality and reliability of a display device having a large screen and a light weight.

While example embodiments of the present invention have been shown and described, it will be understood that the present invention is not limited thereto, and that various changes and modifications may be made by those skilled in the art without departing from the scope of the invention as set forth in the appended claims and their equivalents.

What is claimed is:

1. A display device, comprising:
   a plasma display panel having a screen including a plurality of cells;
   a functional sheet having at least an optical filter function to light emitted from the screen, being brought into intimate contact with a front surface of the plasma display panel and having a structure in which heat diffusion is superior to heat insulation between the plasma display panel and outside air;
   a drive voltage output circuit for giving the screen a drive voltage pulse train that generates display discharge plural times corresponding to a gradation; and
   a controller for controlling the drive voltage pulse train so that power consumption in a unit area in a light emission region within the screen is limited under a set value when one image is displayed.

2. The display device according to claim 1, wherein the controller includes means for detecting a display ratio that is a ratio of the number of cells to be energized to a total number of cells in accordance with display data, and the controller changes a frequency of the drive voltage pulse train in accordance with the detected display ratio.

3. The display device according to claim 1, wherein in an operation under an environment less than or equal to 40° C., a temperature on a front surface of the functional sheet is kept lower than or equal to 70° C., and a temperature on the front surface of the plasma display panel is kept lower than or equal to 80° C.

4. The display device according to claim 1, wherein a weight per square meter of the functional sheet is a value within the range of 0.2–3.0 kilograms.

5. The display device according to claim 1, wherein a thermal conductivity ratio of a material constituting a surface of the functional sheet contacting the plasma display panel is a value within the range of 0.1 $W \cdot m^{-1} \cdot K^{-1}$ to 0.4 $W \cdot m^{-1} \cdot K^{-1}$.

6. The display device according to claim 1, wherein the set value is 2500 watts per square meter.

7. The display device according to claim 6, wherein the controller converges power consumption in the unit area to 1500 watts per square meter in 30 minutes when power consumption per unit area exceeds 1500 watts per square meter.

8. The display device according to claim 1, wherein an instantaneous peak luminance of light emission of the screen on a front surface of the functional sheet is more than or equal to 200 candela per square meter, and a stationary peak luminance of light emission of the screen on the front surface of the functional sheet is more than or equal to 100 candela per square meter.

9. The display device according to claim 1, wherein the functional sheet is a layered film including a front portion containing a coloring matter that absorbs light in a specific wavelength range and a rear portion that does not contain the coloring matter, and a thickness of the rear portion is more than or equal to 0.1 mm.

10. The display device according to claim 9, wherein the rear portion is thicker than the front portion.

11. The display device according to claim 9, wherein the rear portion is a resin layer having a visible light transmittance more than or equal to 80%, which is made of a resin having a variation in the transmittance that is less than 5% over the entire visible light wavelength range after being exposed to an environment at 80° C. for 500 hours.

12. The display device according to claim 9, wherein the rear portion is a resin layer having a visible light transmittance more than or equal to 80%, which is made of a resin having a variation in the transmittance that is less than 5% over the entire visible light wavelength range after being exposed to an environment at 60° C. and of humidity 90% for 500 hours.

13. A display panel device, comprising:
   a plasma display panel having a screen including a plurality of cells;
   a functional sheet having at least an optical filter function to light emitted from the screen, and being brought into intimate contact with a front surface of the plasma display panel; and
   a driving circuit board arranged at the rear side of the plasma display panel, wherein
   the driving circuit board includes a drive voltage output circuit for giving the screen a drive voltage pulse train that generates display discharge plural times corresponding to a gradation, and a controller for controlling the drive voltage pulse train so that power consumption in a unit area in a light emission region within the screen is limited under a set value when one image is displayed.

* * * * *